INVENTOR.
DAVID R. RODAL
BY
Roger A. Marra

INVENTOR.
DAVID R. RODAL
BY
Roger A. Marrs

United States Patent Office 3,411,067

Patented Nov. 12, 1968

3,411,067

TRANSFORMER CONNECTED AMPLIFIER CIRCUITS INCLUDING MEANS FOR MINIMIZING UNBALANCED TRANSFORMER CURRENTS

David R. Rodal, Canoga Park, Calif., assignor to The Bunker-Ramo Corporation, Stamford, Conn., a corporation of Delaware Filed Mar. 14, 1966, Ser. No. 534,217
10 Claims. (Cl. 321—16)

ABSTRACT OF THE DISCLOSURE

A circuit utilizing transformer connected switching amplifiers connected in push-pull relationship and including feedback means for eliminating DC current unbalance in the transformer. The feedback means includes a special transformer secondary winding which operates an error integrating magnetic amplifier to produce a DC output signal. The DC output signal is fed back to the switching amplifier inputs to vary the threshold of a regenerative switch to thus vary the time symmetry of the amplifier output signals coupled to the transformer.

The invention herein described was made in the course of or under a contract or subcontract thereunder, with Bureau of Naval Weapons.

This invention relates to semiconductor switching amplifier circuits and more particularly to a novel saturated switching push-pull amplifier having a transformer-coupled output and which incorporates a feedback loop adapted to greatly reduce any unbalanced current condition which may be present in the output transformer.

In many commercial and military electronic equipment applications, the available primary source of power comprises a direct current battery supply. In some instances, the electronic equipment to be operated requires an alternating current, and often the alternating current must be derived from the low-voltage direct current source by the use of a device referred to in the industry as an inverter. An inverter may be required to deliver substantial power. For example, this power may be of the order of 6,000 watts at a frequency of about 3.5 kilocycles. The inverter must be capable of providing this power and frequency to a load resemblying a series resonant circuit from a 60-volt direct current battery supply.

In the past, it has been the conventional practice to employ an inverter for satisfying such requirements which incorporates a saturated switching semiconductor push-pull amplifier having a transformer-coupled output. In general, the inverter includes a pair of transistors connected in push-pull relationship which are respectively coupled to the opposite ends of a center-tapped primary winding of the output transformer. The transformer's secondary winding is connected to the load.

Difficulties and problems have been encountered when employing inverters of conventional design as described above, which problems stem largely from the fact that push-pull transformer-connected amplifiers using saturated switching semiconductors often suffer from undesirable direct current unbalance currents resulting in inefficiency and power waste. If for any reason, such as different delays within the transistors or non-symmetry of the controlling square wave introduced to the amplifier, the transistors conduct for different time intervals, then a net direct current unbalance current will flow in the transformer. This unbalance current can, over a few cycles, cause the transformer to saturate every half-cycle of the square wave input, thus delivering current spikes to one of the transistors. These current spikes degrade the efficiency of the amplifier and can damage the corresponding transistor. In other words, when transistors are operated in the saturated switching mode and connected in a push-pull transformer-coupled output, a difference in propagation delay exists that is primarily caused by differences in transistor storage time. The result is a net direct current unbalance current in the transformer. The magnitude of this current can be calculated from $$I_{UB}=\frac{2V_{cc}\Delta t}{tR}$$

where $I_{UB}$ is the unbalance current; $V_{cc}$ is the collector-to-emitter supply voltage; R is the equivalent supply resistance (the AC impedance of the power supply plus the DC resistance of the transformer plus the saturation resistance of the transistors); $\Delta t$ is the propagation time difference; and $t$ is the period.

If the magnitude of this unbalance current is small in comparison with the load current, a transformer designed to carry this unbalance current is a satisfactory solution. However, in higher power and higher frequency applications (above 1,000 watts and 1,000 cycles per second), the magnitude of this current is significant when compared with the load current. It then becomes necessary to seek another solution to the problem to conserve power and make more efficient use of the transistor's capability.

The difficulties and problems encountered with conventional inverter circuits as described above are obviated by the present invention, which prevents the development of the above-mentioned current spikes by avoiding an unbalance current in the transformer and by improving amplifier efficiency by the addition of a feedback loop. The feedback loop consists of an integrator, a regenerative switch, and a magnetic amplifier. The present invention provides a circuit that automatically compensates for the time symmetry (duty cycle) of the amplifier input forcing function so as to cancel the time asymmetry caused by the difference in propagation delay.

More particularly, the present invention incorporates a small secondary winding on the output transformer which operates in push-pull relationship with a first and a second transistor switch coupled to windings incorporated in a small square loop magnetic core. If the transistor switches conduct for equal time intervals, the square loop core is biased out of saturation. However, if an unbalance current exists in the output transformer secondary windings, then the first and second transistor switches will conduct for different time intervals, thus saturating the square loop core every half-cycle. As a consequence, one of two capacitors coupled to the transistor switches will be charged proportionally to the amount of unbalance. The square loop core operating as a magnetic amplifier and the integrating capacitors thus provide a direct current signal which is used to control the threshold level of a regenerative switch which is connected to the input of the switching amplifiers. The regenerative switch forms a square wave from a trapezoidal wave form provided by a suitable integrator that is operated by a conventional frequency control source. By varying the threshold level required to operate the regenerative switch, the symmetry of the square wave output is varied. The square wave is employed to control the first and second transistors in the saturable push-pull amplifier circuit driving the output transformer. As a consequence, by varying the time symmetry of the output square wave, the development of an unbalance current condition in the output transformer can be prevented.

In general, the magnetic amplifier feedback circuit provides a direct current output signal, which varies the threshold of the regenerative switch by changing the bias on the input stage thereto from the integrator. The gain of the integrator driving the regenerative switch is designed to produce a trapezoidal output wave to the input of the regenerative switch. As the threshold is varied, the time symmetry of the output of the regenerative switch varies accordingly. Therefore, it may be said that the magnetic amplifier thus converts differnces in time symmetry to a direct current error voltage.

Therefore, a primary feature of the present invention resides in a novel circuit which incorporates a square loop magnetic core as a feedback element in a switching amplifier circuit for controlling the time symmetry of the amplifier output wave. A practical effect of the present invention is to provide greater efficiency as well as to permit the use of transistors having lower current rating than can otherwise be employed. The present invention also reduces the need for ancillary cooling devices and techniques and permits smaller and more dense packaging of component parts. The employment of the present invention offers considerable advantages in connection with applications involving relatively high power inverters, that is, over 1,000 watts, operating in a frequency range within 1,000 to 12,000 cycles per second. The circuit of the present invention in particularly suitable for inverter applications inasmuch as the weight of the inverter can be reduced in direct proportion to its operating frequency, hence inviting applications of the present invention in airborne electronic systems. Furthermore, high power inverter usage is enhanced by the present invention so that the inverter is suitable for use in ultrasonic cleaning equipment and anti-submarine warfare and sonar equipment.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
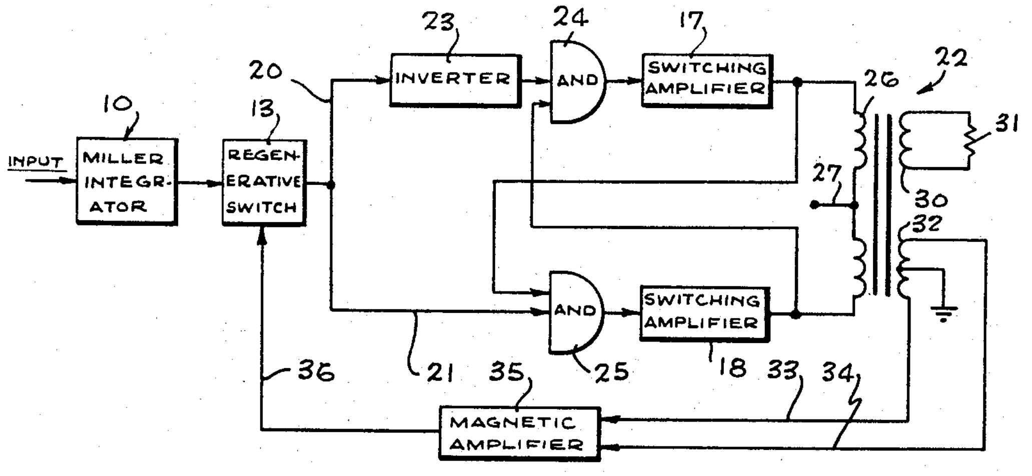
FIGURE 1 is a block diagram of the inverter incorporating the novel time error integrating magnetic amplifier feedback loop of the present invention.

Referring to FIG. 1, a novel electronic system in accordance with the present invention is illustrated in block diagram form which may be employed for compensating for a relatively high magnitude of amplifier unbalance current as compared to the load current which includes a suitable integrator 10 adapted to receive a square wave input from a frequency control means (not shown). The square wave input is indicated by reference numeral 11 set forth in the graphic illustration in FIG. 4*a*. Preferably, the integrator 10 takes the form of a conventional integrator circuit of the type known in the art as a Miller integrator, wherein the gain of the integrator is designed to produce a trapezoidal output wave signal such as is represented by numeral 12 in FIG. 4*b*. An example of a suitable Miller integrator circuit will be described more completely hereinafter in connection with FIG. 3.

The trapezoidal wave signal 12 from the Miller integrator is introduced to a regenerative switch 13, the output of which takes the form of a time interval square wave signal represented by numeral 14 in FIG. 4*c*. The input threshold level of the regenerative switch is set so that the time symmetry of the square wave output signal is established thereby. The relationship of the square wave signal 14 as derived from the trapezoidal signal 12 is indicated in FIGS. 4*b* and 4*c* by means of a broken line 15 which represents the threshold level of the regenerative switch, while the vertical dotted lines 16 indicate the commencement and termination of the output square wave signal 14. Therefore, the time symmetry of the regenerative switch's output is directly dependent upon the threshold level of the regenerative switch operation.

The output of the regenerative switch is introduced to a pair of switching amplifiers 17 and 18 via parallel branches 20 and 21, which are transistors operated in a saturated switching mode and connected in a push-pull transformer-coupled output indicated in the direction of arrow 22. The regenerative switch 13 is coupled to the switching amplifiers 17 and 18 via an inverter 23 in branch 20 and a pair of AND gates 24 and 25 which are included to prevent simultaneous operation of both switching amplifiers.

The output transformer 22 is provided with a center-tapped primary winding 26 which is coupled to a collector-emitter supply voltage via line 27 for operating the transistors of the switching amplifiers 17 and 18. The transformer 22 includes a first secondary winding 30 which is coupled to a load represented by the resistor 31 and which may take the form of a transducer, for example.

Figure 5:
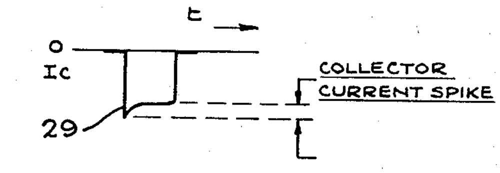
FIG. 5 is a graphic illustration of a typical current spike.

To reiterate the problems solved by the present invention, unbalance current conditions appearing in the output transformer can, over a few cycles, cause the transformer to saturate every half-cycle of the square wave input, thus delivering current spikes to one of the transistors in the push-pull arrangement. Quite often, the current spike will cause a voltage spike to appear across the collector-to-emitter of the switching transistor as it turns to its "off" condition. A collector-to-emitter current spike 29 is more clearly illustrated in the graphic representation shown in FIG. 5. This spike may be close to, or exceed, the current rating of the transistor, and the current spike tends to degrade the efficiency of the amplifier, which can result in damage to the transistors. These spikes are generated in the circuit, or in some instances by the load, and are not spikes appearing on the inverter power source. Even though a transformer having high coupling and low leakage reactance may be employed, undesirable voltage spikes may still exist.

In order to avoid either voltage or current spikes and thus improve amplifier efficiency, the unbalance current in the transformer is prevented, in accordance with the teachings of the present invention, by incorporating a small winding 32 in the sceondary of the output transformer 22. The winding 32 is center-tapped and has its opposite ends connected to a time error integrating magnetic amplifier 35 via lines 33 and 34, which amplifier has an output coupled to the regenerative switch 13 via line 36. The magnetic amplifier 35 provides a direct current output signal which varies the threshold level of the regenerative switch by changing the bias on the input stage thereof. Therefore, as the threshold level of the regenerative switch is varied, the time symmetry of the output square wave signal of the regenerative switch varies accordingly.

For example, if the threshold level of the regenerative switch is changed from that represented by the broken line 15 to a level represented by the broken line 37 shown in FIG. 4*b*, the time symmetry of the square wave signal supplied by the regenerative switch will take the form of a square wave signal 38 as graphically illustrated in FIG. 4*d*. The dotted vertical lines 40 indicate the point at which the rise and fall of the trapezoidal signal 12 crosses the threshold level of the regenerative switch set by the direct current voltage signal to establish the initiation and termination of the time interval forming the square wave signal 38. The propagation time between the signal 14 and the signal 38 is indicated in FIG. 4*c* by the characters $\Delta t$, while the character $t$ indicates the full time period.

Figure 2:
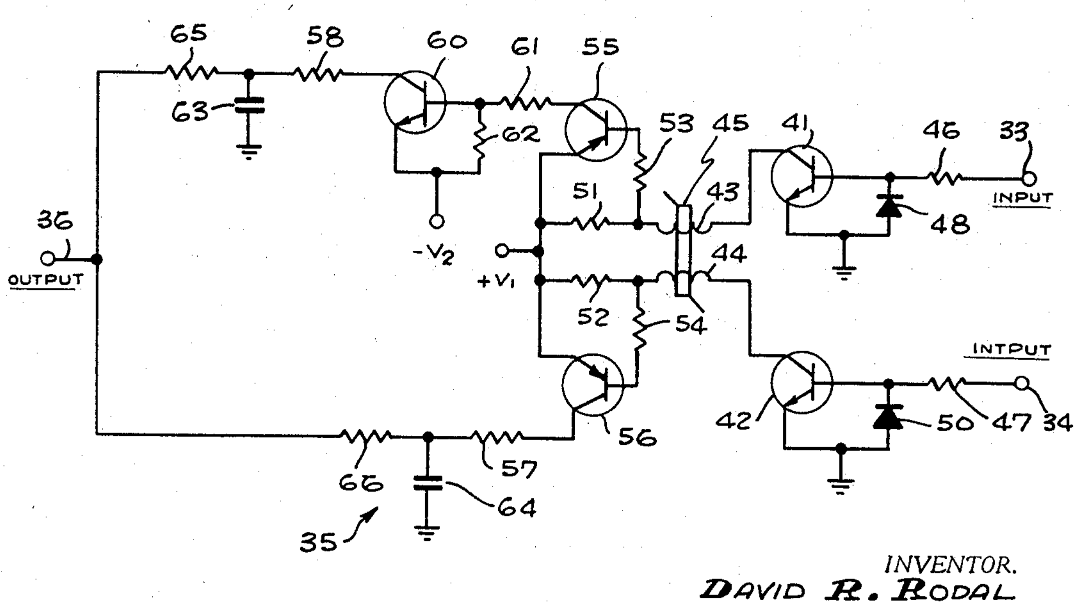
FIG. 2 is a circuit diagram of the time error integrating magnetic amplifier circuit employed in the inverter system illustrated in FIG. 1.

The time error integrating magnetic amplifier 35, which provides the essential conversion from time symmetry to a direct current voltage signal, is shown schematically in FIG. 2. The small secondary winding 32 of transformer 22 provides a push-pull drive to first and second transistor switches 41 and 42, which are coupled to windings 43 and 44, respectively, of a square-loop core 45. Series resistors 46 and 47 provide base-current limiting for transistor switches 41 and 42, while diodes 48 and 50 serve to protect the transistors from excessive reverse base-to-emitter voltage. The transistor switches 41 and 42 operate to alternatively "set" and "reset" the magnetic core 45. Resistors 51 and 52 are employed as current sampling resistors, and resistors 53 and 54 provide base-current limiting for current amplifier transistors 55 and 56. Resistors 57 and 58 are employed to provide collector-current limiting for transistor 55 and inverter transistor 60. Base-current limiting for transistor 60 is provided by resistor 61, while turn-off current for transistor 60 is provided by resistor 62. Capacitors 63 and 64 are employed for filtering purposes, while resistors 65 and 66 are employed for mixing the plus and minus output introduced to the output line 36 coupled to the regenerative switch 13.

In general, if the transistor switches 41 and 42 conduct for equal intervals, the square-loop core 45 will be maintained out of saturation. However, when an unbalance current exists in the output transformer, the transistor switches will conduct for different intervals, causing the square-loop core to saturate every half-cycle. As a consequence, one of the two capacitors 63 and 64 will be charged proportionally to the amount of unbalance. The capacitors thus provide a direct current error signal which is used to control the threshold level of the regenerative switch 13.

In more detail, transistor switches 41 and 42 alternatively switch voltage to the square loop magnetic core 45. The induced voltage is approximately equal to the applied voltage and is different only by the magnetizing current multiplied by the winding resistance. Since the flux in the core is proportional to the integral of the induced voltage, the net flux is equal to the number of cycles times the difference in time that the transistor switches 41 and 42 are in the "on" condition, times the applied voltage, and divided by the number of turns. In equation form, this condition may be represented by:

$$\Phi=\frac{nV_1(t_1-t_2)}{N}$$

From this equation, where N is the number of turns and $n$ is the number of cycles, it can be seen that if $t_1$ equals $t_2$, the net flux is proportional to the number of cycles during which the time unbalance exists. This implies that, if a time unbalance persists for many cycles, the net flux will be great enough to bring the core to saturation. When this occurs, the voltage across the windings drops to 0, thereby allowing the current in the windings to rise. This current increase, in turn, is sensed by either of the current sampling resistors 51 or 52, depending upon whether $t_1$ is greater than $t_2$ or whether $t_1$ is smaller than $t_2$. This current is amplified by transistors 55 or 56, inverted by transistor 60, and integrated by capacitors 63 or 64.

Therefore, it can be seen that if $t_1$ is greater than $t_2$, a negative voltage will be integrated by capacitor 63, and that if $t_1$ is smaller than $t_2$, a positive voltage will be integrated by capacitor 66, to thereby provide the desired direct current output voltage signal whose polarity is dependent upon the time unbalance. Furthermore, since the time that the current is integrated by capacitor 63 or 64 is equal to $t_1$ minus $t_2$, the magnitude of the output voltage is proportional to the magnitude of the time unbalance.

In an actual construction of the time error integrating magnetic amplifier, the following values of the components were used, and the circuit was tested with a 4 kilowatt, 3.5 kilocycle switching amplifier. However, it is to be understood that the values listed below are only illustrative of values which may be employed and that the scope of the present invention is not intended to be limited by these exemplary values.

| | |
|---|---|
| Resistors **46, 47** | 150 ohms. |
| Resistors **51, 52** | 120 ohms. |
| Resistors **53, 54** | 18 ohms. |
| Resistor **61** | 1000 ohms. |
| Resistor **62** | 100 kilohms. |
| Resistors **57, 58** | 10 ohms. |
| Resistors **65, 66** | 7500 ohms. |
| Transistors **41, 42, 60** | 2N2845. |
| Transistors **55, 56** | 2W2907. |
| Capacitors **63, 64** | 10 microfarads. |
| Diodes **48, 50** | 1N4152. |
| $V_1$ | +10 volts. |
| $V_2$ | −10 volts. |
| Magnetic core **45** | 184 turns, 32 ga twisted pair on Magnetic Inc. Core No. 51056–1A. |

Inasmuch as the regenerative switch 13 forms a square wave signal from the input trapezoidal signal provided by the Miller integrator 10, it can be seen that by varying the threshold level of the regenerative switch, the symmetry of the square wave signal output is varied. It is this square wave that is employed to control the first and second transistors 17 and 18, respectively, in the amplifier which drives the output transformer 22. As a consequence, by varying the symmetry of this square wave, the current unbalance in the output transformer can be prevented. One of the novel features of the present invention resides in the use of a square-loop magnetic core as a feedback element in a switching amplifier for controlling the time symmetry of the output wave.

Figures 3, 4:
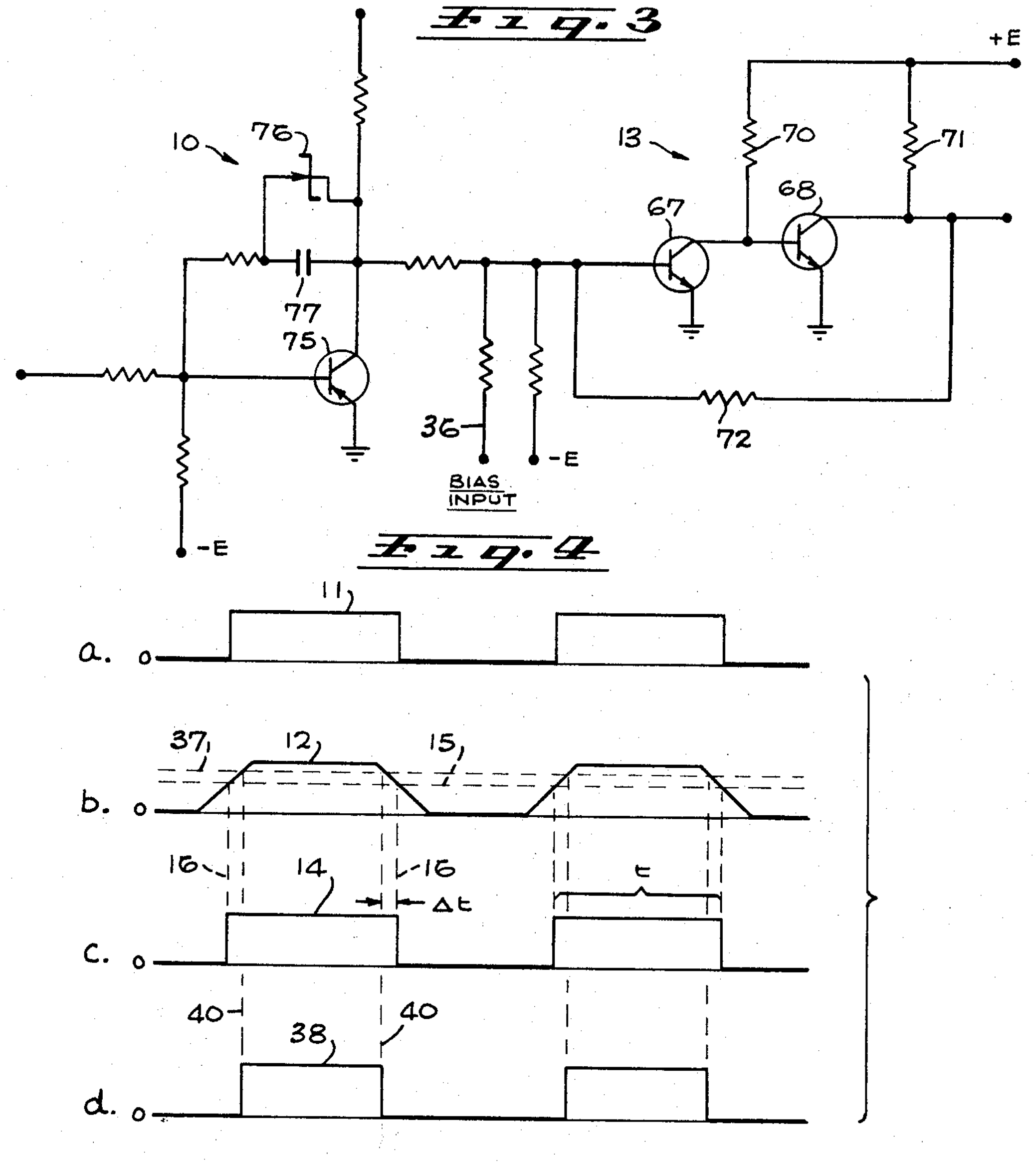
FIG. 3 is a circuit diagram illustrating a suitable integrator and regenerative switch incorporated into the inverter system illustrated in FIG. 1.
FIG. 4 is a set of graphical illustrations of electrical signal wave forms occurring in the circuit of FIG. 1.

Referring now to FIG. 3, a typical circuit for a Miller integrator is shown in the general direction of arrow 10, and a conventional circuit for a regenerative switch is indicated in the general direction of arrow 13. The direct current output voltage signal from the magnetic amplifier 35 is introduced as an input bias signal to the regenerative switch 13 via line 36. The integrator 10 includes a transistor 75 which is coupled to a Zener diode 76 and capacitor 77 network which effects the formation of the trapezoidal signal. Inasmuch as the integrator 10 produces a trapezoidal wave form signal, the direct current voltage signal from the magnetic amplifier feedback loop will bias the operating threshold level of the regenerative switch so as to vary the time symmetry of the square wave output signal from the regenerative switch. In general, the regenerative switch may be considered a direct coupled amplifier wherein a normally non-conducting NPN transistor 67 is connected directly to a normally conducting NPN transistor 68. Resistors 70 and 71 are employed as collector-load resistors, and a feedback resistor 72 couples the collector output of transistor 68 to the base input of transistor 67.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

The embodiments of the invention in which an exclusive property or privilege is claimed are defined as follows:

1. In a circuit having push-pull transformer-coupled amplifiers including saturated switching semiconductors, the combination comprising:

a feedback circuit coupled between the transformer output and the amplifier inputs, said feedback circuit including means for producing a time error integrating signal responsive to the presence of a direct current unbalance current in the transformer output; and means for applying said time error integrating signal to the amplifier inputs for controlling the time symmetry of the amplifier output so as to prevent the above-mentioned direct current unbalance condition.

2. The invention as defined in claim 1 wherein said feedback circuit includes a magnetic amplifier for generating said time error integrating signal as a direct current signal.

3. The invention as defined in claim 2 wherein the transformer output includes a secondary winding coupled to said magnetic amplifier for deriving a voltage signal indicative of the direct current unbalance condition.

4. The invention as defined in claim 3 wherein said feedback circuit includes a pair of transistor switches coupled between said secondary winding and said magnetic amplifier for alternately switching said voltage signal to said magnetic amplifier whereby the flux in said magnetic amplifier is proportional to the integral of said voltage signal.

5. The invention as defined in claim 4 wherein said magnetic amplifier is a square-loop magnetic core and the output of said pair of transistor switches includes windings inductively coupled to said magnetic core.

6. The invention as defined in claim 5 wherein said feedback circuit includes a pair of amplifiers coupled to the output of said magnetic core; and capacitors connected to the output of said last-mentioned amplifiers for integrating said time error integrating signal with the input to the push-pull transformer coupled amplifiers.

7. In an inverter circuit for converting a direct current voltage to an alternating current voltage incorporating a circuit having push-pull saturated switching amplifiers coupled to the primary winding of a transformer subject to a direct current unbalance current output condition, circuit means for preventing the unbalance current condition comprising the combination of:

an integrator circuit for setting the output frequency of the alternating current;

a regenerative switch coupled between said integrator circuit and said amplifiers; and a feedback circuit coupled between the transformer and the input to said regenerative switch, said feedback circuit including magnetic amplifying means for producing a time error integrating signal responsive to the presence of direct current unbalance current in the transformer for controlling the time symmetry of the saturated switching amplifiers.

8. The invention as defined in claim 7 wherein said time error integrating signal modifies the operating threshold level of said regenerative switch.

9. In a push-pull transistor switching circuit having a transformer-coupled output, a feedback loop comprising:

an integrator for generating a trapezoidal output waveform in response to the application of a square wave input signal;

a regenerative switch responsive to the trapezoidal waveform output of said integrator at a given threshold amplitude, said switch having its output connected to the input of said switching circuit to establish a saturated switching mode therein; and a magnetic amplifier having its input connected to the output of said switching circuit and having its output connected to said regenerative switch for producing a direct current error signal which is proportional to the net direct current unbalance in the output transformer of said switching circuit, said error signal being operative to adjust said threshold amplitude of said regenerative switch.

10. The invention as defined in claim 9 wherein said magnetic amplifier includes a square-loop magnetic core which when driven to saturation produces said direct current error signal.

References Cited

UNITED STATES PATENTS

| | | | |
|---|---|---|---|
| 3,027,508 | 3/1962 | Johnson | 321—45 X |
| 3,078,380 | 2/1962 | Ingman | 321—45 |
| 3,101,439 | 8/1963 | Lilienstein et al. | 321—18 X |
| 3,196,336 | 7/1965 | Schmidt | 321—18 |
| 3,237,082 | 2/1966 | Heller et al. | 321—18 |
| 3,248,637 | 4/1966 | Albert et al. | 321—18 |
| 3,327,199 | 6/1967 | Gardner et al. | 321—18 X |

LEE T. HIX, *Primary Examiner.*

W. M. SHOOP, *Assistant Examiner.*